United States Patent [19]

Isono et al.

[11] Patent Number: 5,220,202
[45] Date of Patent: Jun. 15, 1993

[54] MEMORY DEVICE AND MEMORY APPARATUS USING THE SAME SUITABLE FOR NEURAL NETWORK

[75] Inventors: Yasuo Isono; Hiroshi Nakano, both of Tokyo, Japan

[73] Assignee: Olympus Optical Co., Ltd., Tokyo, Japan

[21] Appl. No.: 651,654

[22] Filed: Feb. 6, 1991

[30] Foreign Application Priority Data

Feb. 14, 1990 [JP] Japan .................................. 2-32703

[51] Int. Cl.$^5$ ............................................. H03K 17/00
[52] U.S. Cl. .................................... 307/201; 395/24; 365/45
[58] Field of Search .................... 307/201; 365/45, 46; 395/24

[56] References Cited

U.S. PATENT DOCUMENTS

| | | | |
|---|---|---|---|
| 4,535,349 | 8/1985 | Weinberg | 357/23.6 |
| 4,723,837 | 2/1988 | Masubudri | 357/6 X |
| 4,737,929 | 4/1988 | Denker | 364/807 |
| 4,813,016 | 3/1989 | Okada et al. | 365/107 |
| 4,945,257 | 7/1990 | Morrocco, III | 307/201 |
| 4,996,648 | 2/1991 | Jourjine | 365/45 X |
| 5,055,897 | 10/1991 | Canepa et al. | 307/201 X |
| 5,065,132 | 11/1991 | Taddiken et al. | 307/201 X |
| 5,101,361 | 3/1992 | Eberhardt | 395/24 |

OTHER PUBLICATIONS

Applied Optics, vol. 24, No. 10; May 15, 1985; pp. 1469-1475; "Optical Implementation of the Hopfield Model"; Farhat et al.

*Primary Examiner*—David R. Hudspeth
*Attorney, Agent, or Firm*—Frishauf, Holtz, Goodman & Woodward

[57] ABSTRACT

A memory device includes a nonlinear electric conductivity element, a charge accumulation element, and a switching element. The nonlinear electric conductivity element has an insulating layer having opposite surfaces, and first and second conductive layers respectively formed on the opposite surfaces of the insulating layer. The nonlinear electric conductivity element receives an external write signal applied to one of the first and second conductive layers, and outputs a signal having nonlinear electric conductivity characteristics from the other of the first and second conductive layers. The charge accumulation element has charge accumulation characteristics and is connected to receive and store the signal output from the other of the first and second conductive layers. The switching element is ON/OFF-controlled upon reception of the signal charge stored in the charge accumulation element. The switching element receives an external read voltage to read out the signal charge stored in the charge accumulation element as storage data. A memory apparatus includes a plurality of memory devices each having the nonlinear electric conductivity element the charge accumulation element and the switching element. The plurality of memory devices are connected in a matrix form such that the switching elements in at least two memory devices can commonly receive the read voltage and can commonly read out the storage data.

12 Claims, 9 Drawing Sheets

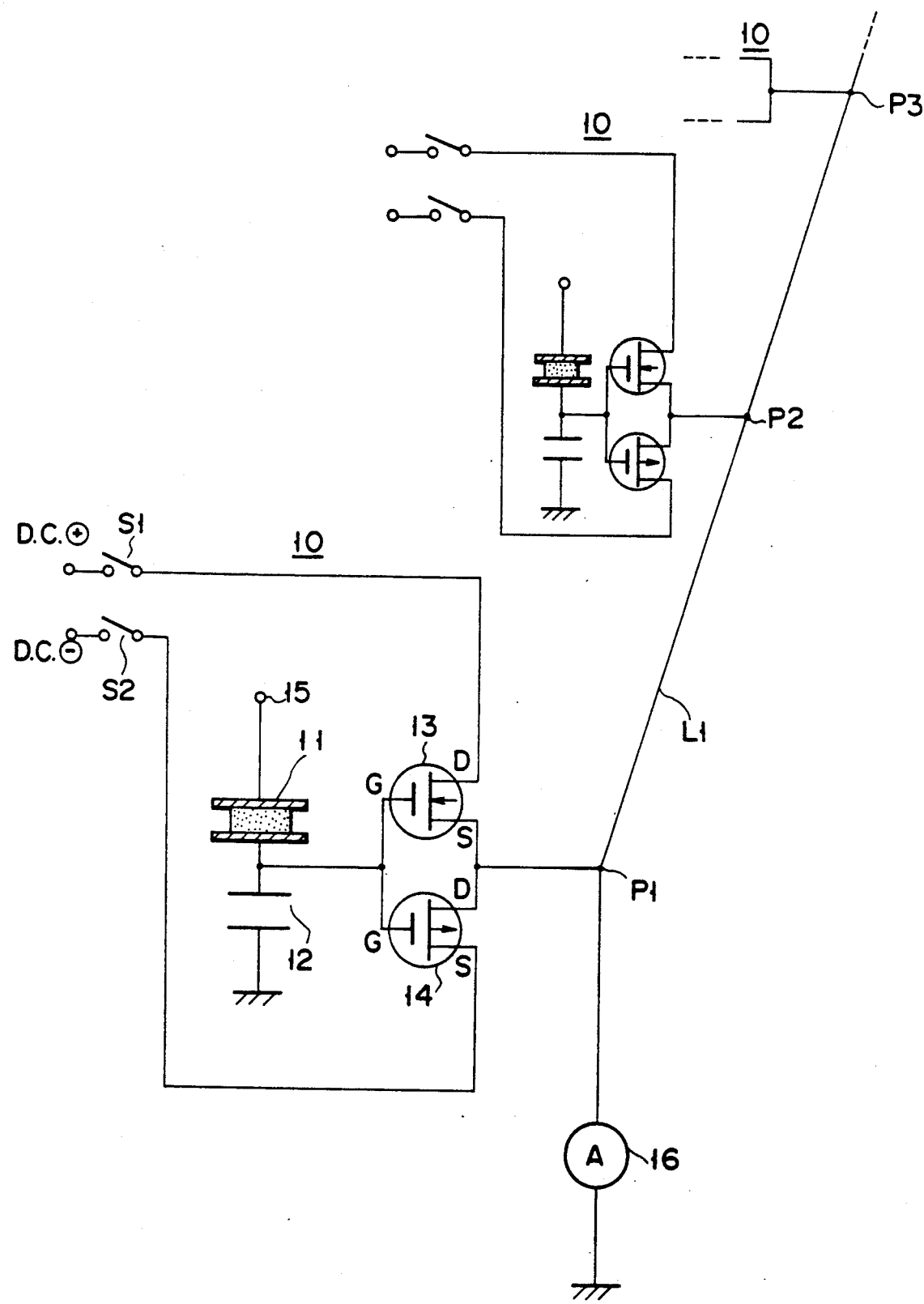
F I G. 1

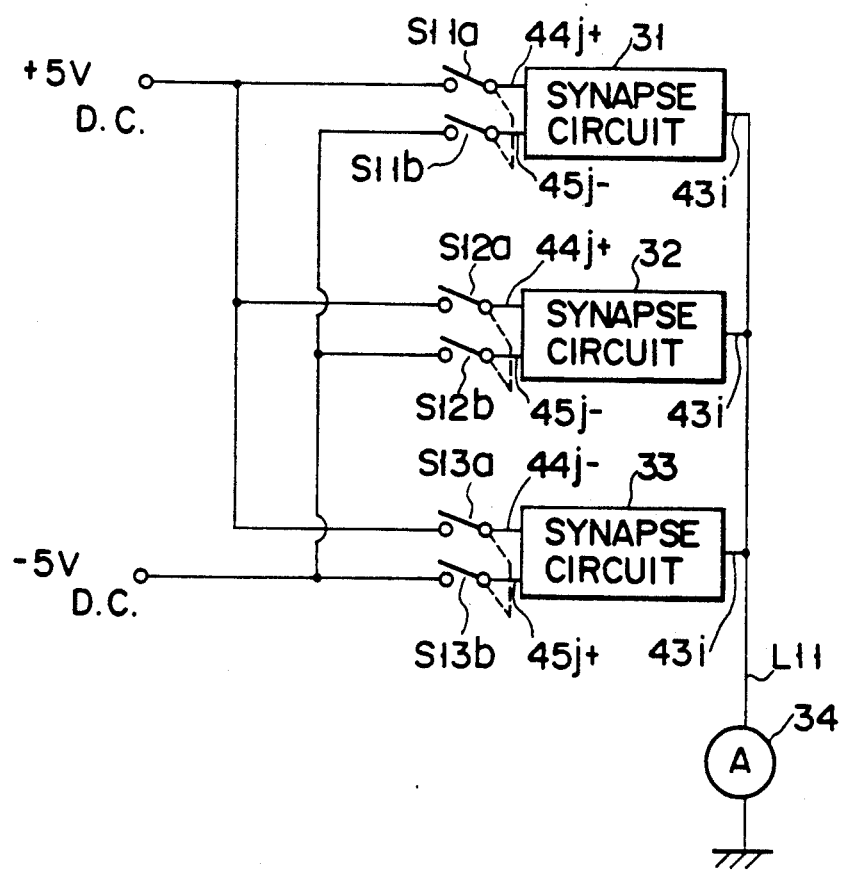
F I G. 5
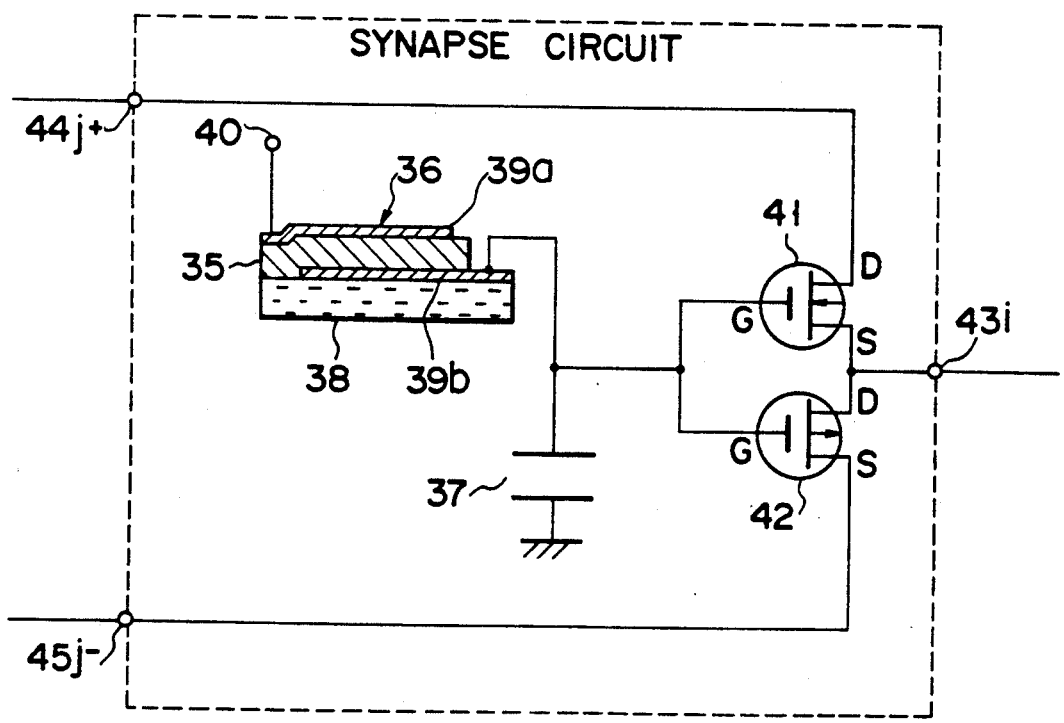
F I G. 6

| SYNAPSE CIRCUIT 31 | CAPACITOR VOLTAGE OF EACH SYNAPSE SYNAPSE CIRCUIT 32 | SYNAPSE CIRCUIT 33 | READING OF AMMETER 34 |
|---|---|---|---|
| + 2 V | + 2 V | + 2 V | + 600 mA |
| + 2 | + 2 | − 2 | + 200 |
| + 2 | − 2 | + 2 | + 200 |
| + 2 | − 2 | − 2 | − 200 |
| − 2 | + 2 | + 2 | + 200 |
| − 2 | + 2 | − 2 | − 200 |
| − 2 | − 2 | + 2 | − 200 |
| − 2 | − 2 | − 2 | − 600 |

FIG. 7

| SWITCH ON | CAPACITOR VOLTAGE OF (i=1, j=1): 0V | CAPACITOR VOLTAGE OF (2,1): +2V | CAPACITOR VOLTAGE OF (3,1): +2V | CAPACITOR VOLTAGE OF (4,1): -2V |
|---|---|---|---|---|
| SWITCH OFF | CAPACITOR VOLTAGE OF (1,2): +2V | CAPACITOR VOLTAGE OF (2,2): 0V | CAPACITOR VOLTAGE OF (3,2): -2V | CAPACITOR VOLTAGE OF (4,2): -2V |
| SWITCH ON | CAPACITOR VOLTAGE OF (1,3): -2V | CAPACITOR VOLTAGE OF (2,3): -2V | CAPACITOR VOLTAGE OF (3,3): 0V | CAPACITOR VOLTAGE OF (4,3): -2V |
| SWITCH OFF | CAPACITOR VOLTAGE OF (1,4): -2V | CAPACITOR VOLTAGE OF (2,4): +2V | CAPACITOR VOLTAGE OF (3,4): +2V | CAPACITOR VOLTAGE OF (4,4): 0V |
| READING OF AMMETER | AMMETER -200mA | AMMETER 0mA | AMMETER +200mA | AMMETER -400mA |

FIG. 9

| | | | | |
|---|---|---|---|---|
| 1 | 0 | +1 | +1 | -1 |
| 0 | +1 | 0 | -1 | -1 |
| 1 | -1 | -1 | 0 | -1 |
| 0 | -1 | +1 | +1 | 0 |
| / | -1 | 0 | +1 | 2 |

$$\hat{v}_i^{(mo)} = \sum_j^N T_{ij} v_j^{(mo)}$$

FIG. 13

$$b_j^{(mo)} = \sum_j^N T_{ij} b_j^{(mo)}$$

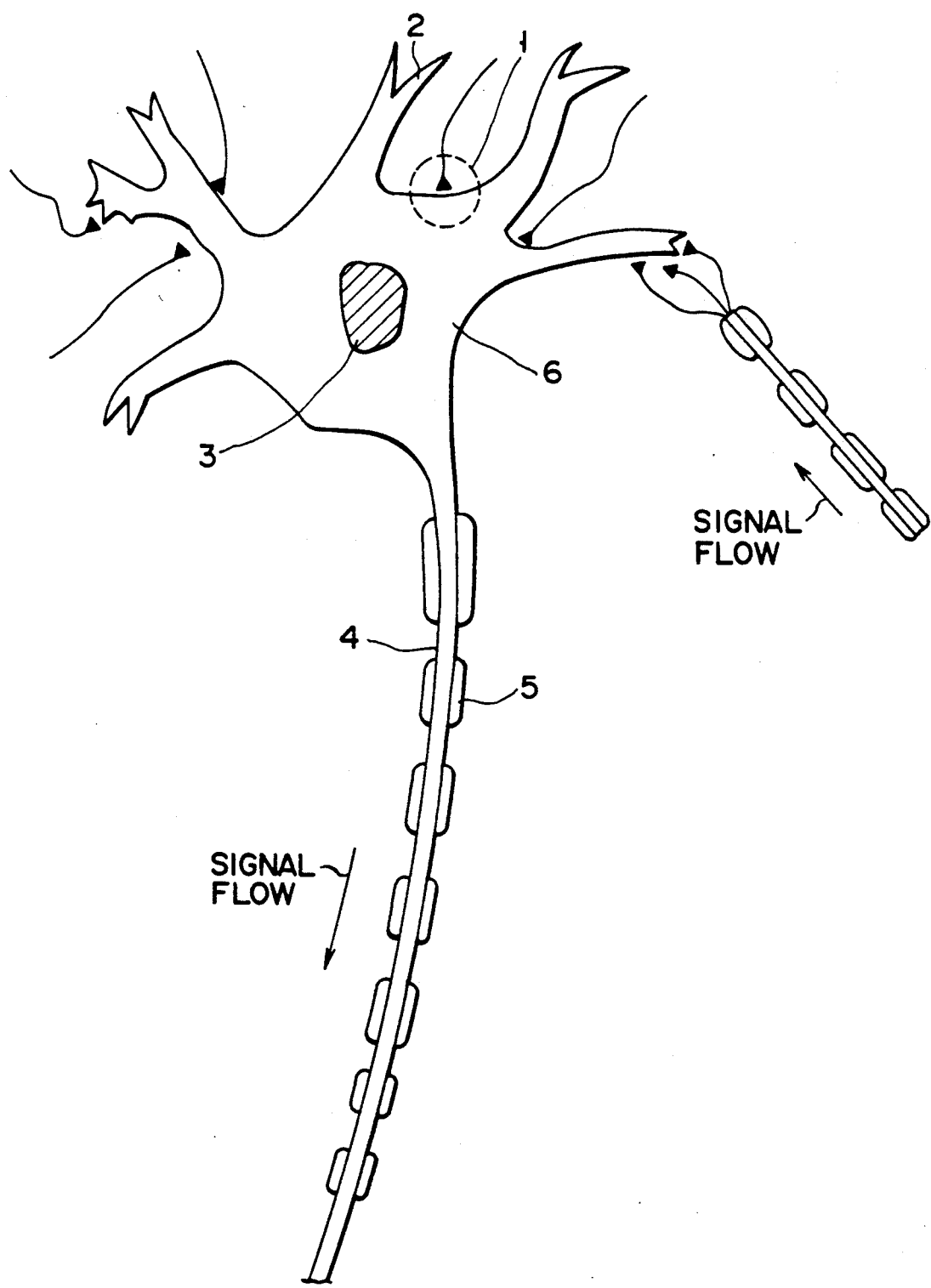
F I G. 14

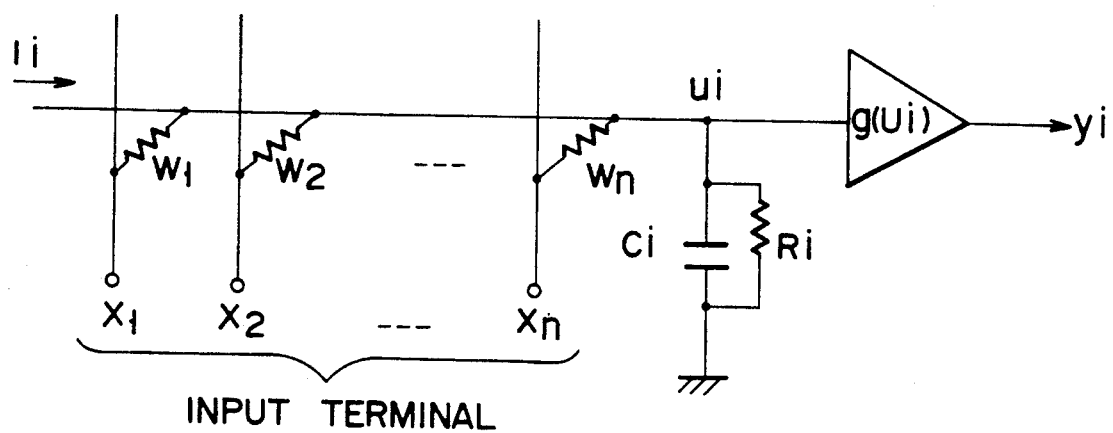
F I G. 15

MEMORY DEVICE AND MEMORY APPARATUS USING THE SAME SUITABLE FOR NEURAL NETWORK

BACKGROUND OF THE INVENTION

1. Field of the Invention

The present invention generally relates to a memory device and a memory apparatus using the same and, more particularly, to a memory device which functions as a neuron element and a memory apparatus using the same suitable for a neural network.

2. Description of the Related Art

In recent years, extensive studies have been made on data processing using neural networks, and neural networks are used in a variety of applications such as pattern recognition for graphic and character patterns, speech recognition, mechanical control of a robot or the like, and recognition processing, data compression, and image reproduction in an expert system or the like. In particular, the field of recognition is regarded as one of the fields to which a neural network can be easily applied.

As opposed to a conventional Neuman computer suitable for serial data processing mainly using numeric values and symbols, neural networks are regarded to be suitable for parallel processing calculation models. More specifically, neural networks are suitable for realizing calculation models simulating functions and structures of a brain and neural network of a living body. A system having these functions and structures realized by electronic circuits, optical circuits, and the like is called a neuro-computer.

FIG. 14 shows a structure of a nerve cell (neuron) of a living body. The nerve cell is divided into synapses 1, dendrites 2, axis cylinders 4, and a cell body 6 in accordance with data processing functions. One neuron is regarded as one logic operation circuit when each neuron is exemplified as an electronic circuit. Each synapse 1 serves as an interface for receiving signals from other neurons. A signal input to this synapse 1 is transmitted to the cell body 6 through the corresponding dendrite 2 (input line). The cell body 6 adds inputs input from the plurality of dendrites 2. When the sum exceeds a predetermined value, this neuron outputs a signal to the next neuron through the corresponding axis cylinder 4 (output line). Each synapse 1 takes an excitatory or inhibitory action. A signal input from an excitatory synapse serves to increase a signal level of the cell body 6. A signal input from an inhibitory synapse serves to decrease the signal level of the cell body 6. When the synapse 1 is to transmit a signal to the cell body 6, the intensity of an output signal is changed in accordance with a source neuron of the input signal. The signal intensity is called a coupling weighting coefficient. A memory function and a processing capacity of a neural network in a living body are generally deemed to depend on a way of connections between neurons and a pattern formed by weighting coefficients of these neurons.

A human brain is said to have about $10^{10}$ neutrons. Since a large number of data are subjected to parallel processing in the neural network, a very large amount of data can be processed per unit time although an operating frequency of one neuron is low.

When a neural network model is formed on, e.g., an LSI chip on the basis of the data processing technique of a human brain, a high-speed practical system can be arranged at low cost. As a result, data processing without using any program can be realized, and a software development load which is increasing year by year can be reduced. In addition, this system is expected to facilitate future developments in image recognition, pattern recognition, and speech recognition, which are difficult to handle in conventional serial processing computers.

Taking the extensive studies on data processing techniques into account, studies and developments for realizing neural network hardware (i.e., a neuro-chip) have been positively made. The types of signals to be processed in such a neuro-chip are classified into a current (or voltage) signal and an optical signal. Signals to be processed by an electrical neutron are classified into analog and digital signals.

A neuro-chip for processing an analog electrical signal will be described below. An arrangement of the simplest neuro-chip will be described below. That is, the arrangement is constituted by a plurality of operation elements each for outputting y given below in response to an input xi (i=1, 2, 3, ..., n):

$$y = 1 (X \geq 0) \\ y = 0 (X \geq 0) \quad (1)$$

for $$X = \sum_{i=1}^{n} wixi - \theta \quad (2)$$

The operating elements correspond in analogy to neurons in a neural network in a living body in operation and are generally called neuron elements.

An equivalent circuit of such a neuron element is arranged by an electronic analog circuit, as shown in FIG. 15.

In a transient state, the following equation can be obtained by the Kirhihoff's law:

$$Ci(dui/dt) = \sum_{i=1}^{n} wixi - (ui/Ri) + Ii \quad (3)$$

In a steady state, dui/dt=0 is obtained, so that $$ui/Ri = \sum_{i=1}^{n} wixi + Ii \quad (4)$$

When $\theta$ is substituted into $-Ii$ in equation (4) and Ri=1, equation (4) coincides with equation (2). In this case, ui corresponds to X.

When a function g(ui) of an amplifier is exemplified as follows:

$$y = g(ui) = \frac{1}{1 + \exp\left(\frac{-X}{\lambda}\right)} \quad (5)$$

If $\lambda$ is set to 0, the function g(ui) coincides with equation (1).

Attempts for realizing neural network chips having analog neurons as described above have been positively made. In this case, it is very important to determine the type of element to be used as each resistor wi in FIG. 15.

The resistor wi serves as a weighting element for receiving each input signal xi, i.e., serves as a circuit element corresponding to the synapse 1 in a neuron. This resistor wi is constituted by a type using an ON resistance of a MOS transistor, a type using the number of ON transistors, a type for turning on/off a transistor using a RAM, a type using Amorphous Si:H, and a type using MNOS as follows:

In the types using the ON resistances of MOS transistors or the number of ON transistors as the resistors wi, operations of all parts including a memory unit are performed by only transistors. Therefore, the number of transistors is very large, and the circuit arrangement is very complicated.

In the types wherein a memory unit for storing the resistors wi serving as weighting elements is obtained by using a transistor circuit (i.e., an arrangement including a RAM), or MNOS, a storage value is a unipolar value (i.e., either positive or negative). However, synapses of neurons are generally classified into excitatory and inhibitory synapses as described earlier. In order to perform identical actions to these synapses in an electronic circuit, the weighting element wi must have a bipolar value (both positive and negative). In a circuit wherein a value of a weighting element wi is set by using a memory having a unipolar value, a circuit must be constituted by two areas, i.e., an area in charge of positive (excitatory) coupling and an area in charge of negative (inhibitory) coupling. For this reason, the number of elements is increased, and the circuit arrangement is further complicated. In addition, signal processing is also complicated.

When amorphous Si:H is used for the resistor, the amorphous Si:H film must perform both an operation for storing the resistor element wi and coupling (current control), thus advantageously reducing the number of elements. However, the wi value is a unipolar value as in the previous elements, and complication of the circuit and signal processing is not yet avoided. In addition, since an electrical resistance of amorphous Si:H is relatively large, a signal processing speed is low, resulting in inconvenience.

SUMMARY OF THE INVENTION

It is, therefore, an object of the present invention to provide a new and improved memory device capable of functioning as a neuron element which has a small number of circuit elements and is useful to realize a neural network whose circuit arrangement and data processing are simple.

It is another object of the present invention to provide a memory apparatus using the above memory device which has a small number of circuit elements and is useful to realize a neural network whose circuit arrangement and data processing are simple.

According to one aspect of the present invention, there is provided a memory device comprising:

a nonlinear electric conductivity element, having an insulating layer with opposite surfaces, and first and second conductive layers respectively formed on the opposite surfaces of the insulating layer, for receiving an external write signal applied to one of the first and second conductive layers and outputting a signal having nonlinear electric conductivity characteristics from the another of the first and second conductive layers;

a charge accumulation element having charge accumulation characteristics and coupled to receive and store the signal output from the other of the first and second conductive layers; and switching means, ON/OFF-controlled upon reception of a signal charge stored in the charge accumulation element, for receiving an external read voltage to read out the signal charge stored in the charge accumulation element as storage data.

According to another aspect of the present invention, there is provided a memory apparatus comprising:
a plurality of memory devices, each having
(a) a nonlinear electric conductivity element, having an insulating layer with opposite surfaces, and first and second conductive layers respectively formed on the opposite surfaces of the insulating layer, for receiving an external write signal applied to one of the first and second conductive layers and outputting a signal having nonlinear electric conductivity characteristics from the another of the first and second conductive layers;
(b) a charge accumulation element having charge accumulation characteristics and coupled to receive and store the signal output from the other of the first and second conductive layers; and
(c) switching means, ON/OFF-controlled upon reception of a signal charge stored in the charge accumulation element, for receiving an external read voltage to read out the signal charge stored in the charge accumulation element as storage data;
first connecting means connected to cause the switching elements of at least two of the plurality of memory devices to commonly receive the external read voltage; and
second connecting means connected to cause the switching elements of the at least two memory devices to commonly read out the storage data,
whereby the plurality of memory devices are connected in a matrix form.

More specifically, in order to solve the above problems described above, according to the present invention, there is provided a memory device comprising a nonlinear electric conductivity element having nonlinear electric conductivity characteristics and consisting of an insulating layer and conductive layers formed on upper and lower surfaces of the insulating layer, a charge accumulating element having charge accumulation characteristics and connected in series with the nonlinear electric conductivity element, and a switching element, ON/OFF-controlled by a voltage of the charge accumulation element, for reading out data stored in the charge accumulation element in response to a read voltage applied thereto.

In order to solve the above problems, the switching element comprises a first transistor applied with a positive read voltage and ON/OFF-controlled by the voltage of the charge accumulation element, and a second transistor applied with a negative read voltage and ON/OFF-controlled by the voltage of the charge accumulation element.

In order to solve the above problems, the plurality of memory devices are arranged, the input terminals of at least two memory elements which receive the read voltage are commonly connected, and read output terminals of the switching elements of these memory devices are commonly connected, thereby constituting a matrix wiring by the plurality of memory devices.

With the above means, when a write voltage based on input data is applied to the nonlinear electric conductivity element, the nonlinear electric conductivity element is ON/OFF-controlled to accumulate the input data as a charge in the charge accumulation element. When a read voltage is applied to the switching element, e.g., "1" or "0" data is read out on the basis of the charge accumulated in the charge accumulation element, i.e., the storage data.

Since the switching element is constituted by the first and second transistors applied with the positive and negative voltages, respectively, one memory device can realize the excitatory and inhibitory actions of a synapse.

Since the memory devices are connected in a matrix form and the output terminals of the switching elements are commonly connected between the plurality of memory devices, parallel processing can be performed in the plurality of memory devices in response to vector data upon storage of vector operation data in the charge accumulation elements, thereby obtaining neuron elements.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a part of the specification, illustrate presently preferred embodiments of the invention and, together with the general description given above and the detailed description of the preferred embodiments given below, serve to explain the principles of the invention, in which:

FIG. 1 is a diagram showing a memory device according to the first embodiment of the present invention;

FIG. 5 is a diagram showing an arrangement of a memory apparatus according to the second embodiment of the present invention;

FIG. 6 is a view showing a synapse circuit shown in FIG. 5;

FIG. 7 is a table showing a relationship between an accumulation charge and a read current in the memory apparatus shown in FIG. 5;

FIGS. 9 and 10 are tables showing a relationship between an accumulation charge and a read current in the memory apparatus in FIG. 8;

FIGS. 11 and 12 are views for explaining matrix operations of the third embodiment;

FIG. 13 is a view for explaining matrix operations of the fourth embodiment;

FIG. 14 is a view showing a nerve system; and

FIG. 15 is an equivalent circuit diagram of the nerve system in FIG. 14.

DETAILED DESCRIPTION OF THE PREFERRED EMBODIMENTS

Figure 2:
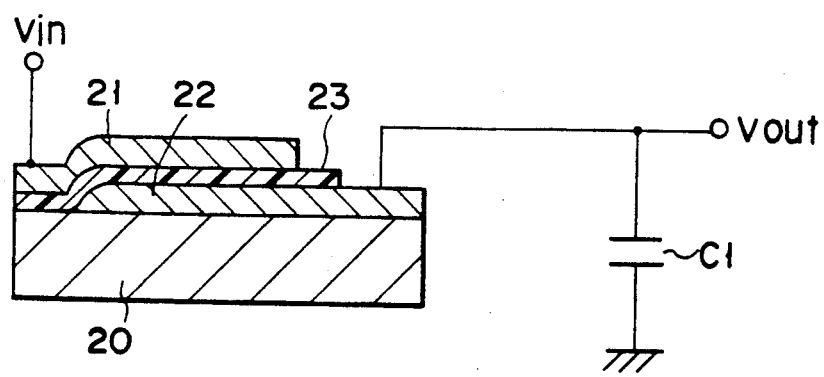
FIG. 2 is a view for explaining a memory function of an MIM device shown in FIG. 1.

Reference will now be made in detail to the presently preferred embodiments of the invention as illustrated in the accompanying drawings, in which like reference characters designate like or corresponding parts throughout the several drawings.

FIG. 1 is a diagram showing a memory device according to the first embodiment of the present invention. In this memory device, an MIM (metal-insulator-metal) element 11 having nonlinear electric conductivity characteristics and a capacitor 12 serving as a charge accumulation element are connected in series between a write electrode 15 and ground. A connecting point between the capacitor 12 and the MIM element 11 is connected so that a voltage stored in the capacitor 12 is commonly applied to gate electrodes G of an n-channel metal-oxide-semiconductor (n-MOS) field effect transistor (FET) 13 and a p-channel metal-oxide-semiconductor (p-MOS) FET 14. A drain electrode D of the n-MOSFET 13 is connected to a positive DC voltage source DC$\oplus$ through a switch S1 and receives a positive voltage. A source electrode S of the p-MOSFET 14 is connected to a negative DC voltage source DC$\ominus$ through a switch S2 and receives a negative voltage. The MIM element 11, the capacitor 12, the n-and p-MOSFETs 13 and 14, and the switches S1 and S2, arranged as described above, constitute one neuron element (synapse circuit) 10. In this embodiment, source electrodes S of the n-MOSFETs 13 and drain electrodes D of the p-MOSFETs 14 of the neuron elements 10, that is, output terminals P1, P2, ... of the neuron elements 10 are commonly connected to a read line L1.

The MIM element 11 comprises an LB film (a monomolecular film or a multilayered film of such monomolecular films formed by the Langmuir-Blodgett method) and two metal electrodes formed on the upper and lower surfaces of the LB film. One electrode is connected to the write electrode 15, and the other electrode is connected to the capacitor 12. A series circuit of the MIM element 11 and the capacitor 12 exhibits a hysteresis phenomenon.

A memory function utilizing this hysteresis phenomenon will be described below. For example, as shown in FIG. 2, in an MIM structure wherein an insulating layer 23 and two metal electrodes 21 and 22 sandwiching the insulating layer 23 therebetween are formed on a substrate 20, when the insulating film 23 comprises a thin film having a thickness on the order of 100 Å, a tunnel current flows between the two metal electrodes 22 and 23. This tunnel current exhibits nonlinear current voltage characteristics.

Figure 3:
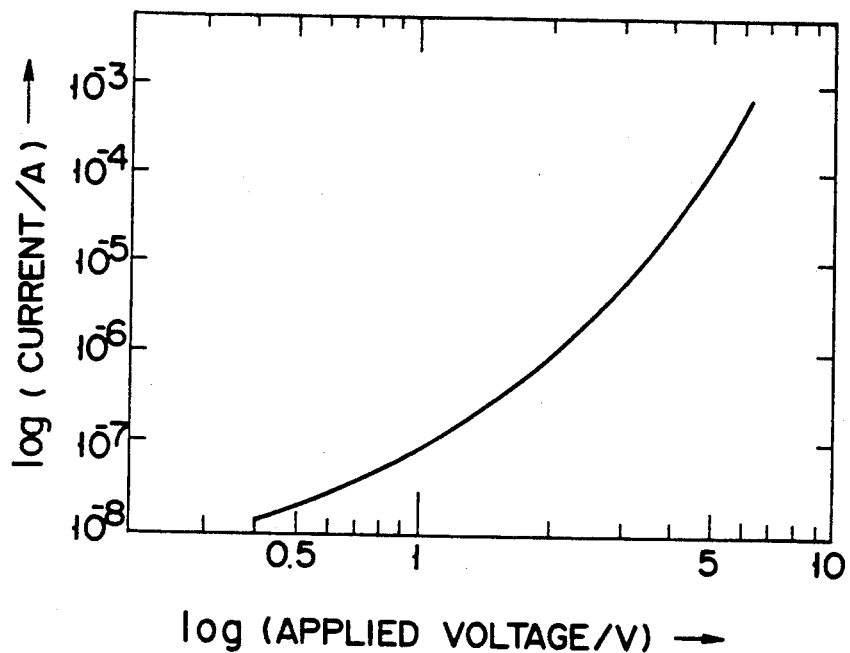
FIGS. 3 and 4 are graphs for explaining a hysteresis phenomenon of the memory circuit shown in FIG. 1.
Figure 4:
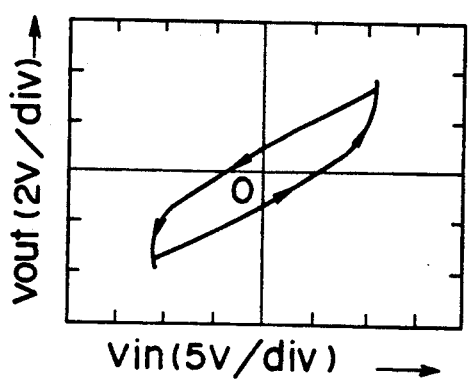

For example, when polyimide as an organic polymer compound is used to form a thin film as the insulating film 23 in accordance with the LB method, the current voltage characteristic curve corresponding to a thickness of 120 Å is shown in FIG. 3. This characteristic curve is almost an exponential curve. The MIM structure serves as a switching element which is set in an ON state in a high voltage region but is set in an OFF state in a low voltage region. When this MIM element is connected in series with a capacitor C1 and a rectangular wave symmetrical on the positive and negative sides is input to a write terminal Vin of the MIM element, a voltage at a terminal Vout for outputting an accumulation voltage of the capacitor C1 in response to an input voltage at the write terminal Vin exhibits a hysteresis shown in FIG. 4. More specifically, the rising voltage at the output terminal Vout has a different curve from the falling voltage at the output terminal Vout even if the same voltage pattern is applied to the write terminal Vin. For this reason, the MIM element serves as a charge memory for storing a positive voltage when a single positive pulse is applied to the element, and for storing a negative voltage when a single negative pulse is applied to the element. Detailed operations of the MIM element are described in U.S. Appln. Ser. No. 500,773 filed on Mar. 28, 1990 by one of the present applicants.

An operation of the memory device having the above arrangement will be described below.

A voltage based on data to be stored is applied to the write electrode 15 of the MIM element 11 and is stored in the capacitor 12. A positive voltage is applied to the drain electrode D of the n-MOSFET 13 through the switch S1, and a negative voltage is applied to the source electrode S of the p-MOSFET 14 through the switch S2. As a result, a positive or negative current is commonly read out to the common read line L1 in accordance with the polarity of the charge stored in an capacitor 12. This readout current is measured at an ammeter 16 having one terminal connected to the common read line L1 and the other terminal grounded.

For example, when a positive voltage is applied to the capacitor 12, only the n-MOSFET 13 is turned on, and a current flow from the source electrode S of the n-MOSFET 13 to ground (to be referred to as a positive current hereinafter) is measured at the ammeter 16. On the other hand, when a negative voltage is applied to the capacitor 12, only the p-MOSFET 14 is turned on, a current flows from the drain electrode D of the p-MOSFET 14 (to be referred to as a negative current hereinafter) and is measured at the ammeter 16. A circuit as a combination of a memory circuit consisting of the MIM element 11 and the capacitor 12 and a complementary connection of the n- and p-MOSFETs 13 and 14 is called a "synapse circuit" in correspondence with a neuron of a living body.

A memory element of this embodiment described above will be described in correspondence with a neuron element whose equivalent circuit is shown in FIG. 15. Referring to FIG. 15, each resistor wi (W1, W2, .. . , Wn) which connects the corresponding input terminal xi and a load resistor Ri corresponds to a drain-source resistance of the n- or p-MOSFET 13 or 14 in FIG. 1. The magnitude of the drain-source resistance is determined by causing a series circuit of the MIM element 11 and the capacitor 12 to excite the gate electrode of the MOSFET 13 or 14 in accordance with control data stored in the capacitor 12. The n- or p-MOSFET 13 or 14 is turned on in accordance with the polarity of the control data stored in the capacitor 12. Since the n- or p-MOSFET 13 or 14 serves as a coupling resistance for a positive or negative current, the synapse circuit constituted by the memory device of the present invention has a coupling function of excitatory and inhibitory characteristics. A synchronous operation for opening/closing the switches S1 and S2 has a function of applying bias voltages respectively to the n- and p-MOSFETs 13 and 14 and corresponds to an operation for applying an input signal to the input terminal xi in FIG. 15.

Since the load resistor Ri in FIG. 15 serves as an element for converting a current flowing through the circuit into a voltage and for allowing observation of the converted voltage, the load resistor Ri functionally corresponds to the ammeter 16 in FIG. 1. Although the amplifier for amplifying the weighted input signal in FIG. 15 is not arranged in FIG. 1, it is easy to convert the current measured at the ammeter 16 into a voltage. As shown in FIG. 15, the plurality of coupling resistors wi are connected to one load resistor Ri, and the input terminals xi are respectively connected to the coupling resistors wi. A plurality of synapse circuits each having a function corresponding to the coupling resistor wi and the input terminal xi in FIG. 1 are connected to the common read line L1. Currents flowing through the respective synapse circuits are added in consideration of the polarities of the currents, and the sum is measured at the ammeter 16, as in the equivalent circuit of FIG. 15.

As described above, since the memory device of this embodiment functionally corresponds to the equivalent circuit of the neuron element shown in FIG. 15, the memory device can serve as the neuron element. In the memory device of this embodiment, since the synapse circuit is constituted by two MOSFETs 13 and 14, one MIM element 11, and one capacitor 12, the number of circuit parts is small, and the circuit arrangement can be simplified. As a result, the integration density of a neuron element chip can be increased, and power consumption can be reduced (heat generation can be reduced). The parasitic capacitance of the synapse circuit can be reduced, and its operating frequency can be advantageously increased to perform a high-speed operation. This simple circuit arrangement prevents interference between the constituting elements or wiring layers. A degree of propagation of variations in constituting elements can be reduced, thereby facilitating the manufacture of stably operated memory devices with good reproducibility.

In the memory device of this embodiment, since the LB film used as the I layer (insulating film) of the MIM element 11 does not require a monocrystalline material for the substrate 20, the LB film can be easily formed on a relatively flat metal deposition surface. When synapse circuits are to be integrated into a chip, the MIM elements can be relatively easily formed on the capacitors 12 to obtain a three-dimensional arrangement, thus further increasing the integration density. Since the MIM element 11 can be manufactured without performing a pretreatment such as etching of an insulating film between the wiring patterns and a passivation film of a transistor, the chip formation process can be greatly simplified.

Since the two M layers (electrodes) of the MIM element 11 can be formed by one material, their switching characteristics have symmetry with respect to the positive and negative bias voltages. Therefore, the memory circuit constituted by a series connection of the MIM element 11 and the capacitor 12 can be a bipolar memory capable of storing positive and negative voltages. This indicates that the memory circuit satisfies the most essential requirements of the neuron element which can perform excitatory and inhibitory actions. More specifically, a voltage from the capacitor 12 is supplied to the gates of the two complementarily connected MOSFETs 13 and 14 to provide excitatory and inhibitory actions to one synapse circuit. Since the semiconductor memory such as a RAM or ROM used in the conventional neuron element has a unipolar characteristic, i.e., either the positive or negative polarity, the coupling resistors controlled by the unipolar value have only excitatory or inhibitory values. As a result, as compared with a conventional arrangement having two independent systems, i.e., excitatory and inhibitory synapse circuits in one neuron element, the same operation as in the conventional arrangement can be performed by this embodiment even if the number of synapse circuits is reduced into ½. This indicates the advantages described above, i.e., that the number of circuit elements is small and the circuit is simple, thereby advantageously increasing the integration density of the device.

A voltage (memory voltage) charged in the capacitor 12 in the memory device in this embodiment can be erased by applying a voltage having a polarity opposite to that in writing of the memory voltage, so that new data can be written in this memory device. This indicates that the coupling state of synapses can be changed. Various characteristics can be provided to neuron elements manufactured in the same process, and their characteristics can be changed during the manufacture, thereby increasing a variety of applications.

The second embodiment will be described below.

FIG. 5 is a diagram showing an arrangement of a memory apparatus according to the second embodiment of the present invention. Reference numerals 31, 32, and 33 denote synapse circuits. One terminal of each of the synapse circuits 31 to 33 is connected to a +5-V DC voltage source through a corresponding one of switches S11a, S12a, and S13a. The other terminal is connected to a −5-V DC voltage source through a corresponding one of switches S11b, S12b, and S13b. The output terminals of the synapse circuits 31 to 33 are connected to a common read line L11, one terminal of which is grounded.

A detailed arrangement of each of the synapse circuits 31 to 33 is shown in FIG. 6. As shown in FIG. 6, each of the synapse circuits 31 to 33 has the same basic arrangement as that of the neuron element 10 shown in FIG. 1. A memory circuit comprises a series circuit of an MIM element 36 having a polyimide LB film 35 as an I layer and a capacitor 37. In the MIM element 36, slide glass serves as a substrate 38, aluminum deposition films respectively serve as upper and lower electrodes (M) 39a and 39b, and the polyimide LB film 35 of a 40-molecular layer (thickness: 160 Å) serves as an insulating layer. The aluminum electrodes 39a and 39b have a circular shape having a diameter of 3 mm. Gate electrodes G of an n-channel field effect transistor (FET) 41 and a p-channel FET 42 are respectively connected to one electrode 39b of the MIM element 36 and one electrode of the capacitor 37 the other electrode of which is grounded. A commercially available transistor (e.g., model 2SK216) was used as the n-channel FET 41, and a commercially available transistor (e.g., model 2SJ79) was used as the p-channel FET 42. When voltages of ±9 V were applied to the write electrode 40, voltages of ±2 V were recorded as memory voltages in the capacitor 37. Sources S of the n-channel FETs 41 and drain electrodes D of the p-channel FETs 42 in the synapse circuits 31 to 33 are connected to output terminals 43i. The output terminals 43i of the synapse circuits 31, 32, and 33 are commonly connected to an ammeter 34. Terminals 44j+ serving as drain electrodes D of the n-channel FETs 41 are commonly connected to the +5-V DC voltage source respectively through the switches S11a, S12a, and S13a. Similarly, terminals 45j− serving as source electrodes S of the p-channel FETs 42 of the respective synapse circuits are connected to the −5-V voltage source respectively through the switches S11b, S12b, and S13b. The switches S11a to S13b connected to the terminals 44j+ and 45j− are interlocked in units of synapse circuits 31, 32, and 33.

The basic operation of the memory apparatus of this embodiment is the same as that in the first embodiment. More specifically, in a synapse circuit whose capacitor 37 is charged with +2 V, when the input switch is turned on, only the n-channel FET 41 is turned on, and a current of +200 mA flows from the terminal 44j+ to the ammeter 34 through the terminal 43i. Similarly, when the capacitor 37 is charged with −2 V, a current of −200 mA flows in the ammeter 34. When the capacitor 37 is not charged at all, neither the FET 41 nor the FET 42 are turned on, and no current flows. The ammeter 34 measures a sum of currents flowing therethrough.

As shown in FIG. 7, for example, the capacitors 37 in the synapse circuits 31, 32, and 33 are charged with various combinations of voltages of ±2 V. That is, weighting of excitatory and inhibitory connections is stored in a various combinations. Note that results are obtained when all the input switches S11, S12, and S13 are turned on (i.e., signals are input to all the synapse circuits) for illustrative convenience.

In this case, the reading of the ammeter 34 indicates a sum of coupling currents controlled by the synapse circuits.

It was confirmed that the memory apparatus of the second embodiment could serve as a very simple electronic circuit which could perform the same operations as those of the neuron of the living body shown in FIG. 15.

This memory apparatus can be used as a unit neuron element to arrange a neural network chip. When the memory apparatus of this embodiment is used, the same effect as in the first embodiment can be obtained.

The third embodiment of the present invention will be described below.

Figure 8:
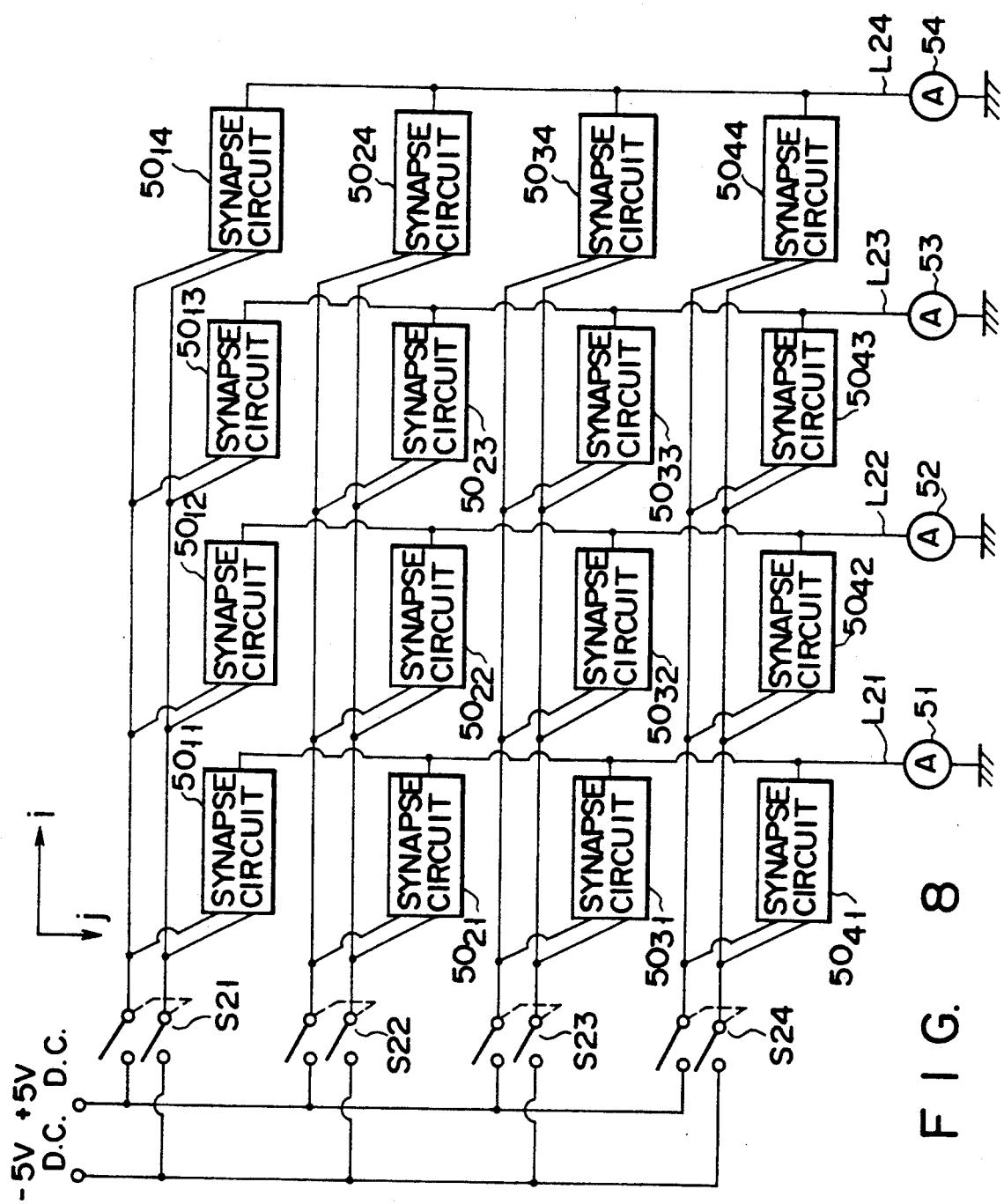
FIG. 8 is a diagram showing an arrangement of a memory apparatus according to the third embodiment of the present invention.

FIG. 8 is a diagram showing an arrangement of a memory apparatus according to the third embodiment of the present invention. This memory apparatus is obtained by arranging 16 synapse circuits $50_{(i,j)}$ ($50_{11}$ to $50_{44}$) having the same arrangement as the synapse circuit in FIG. 6 in a 4×4 (=16) matrix. The synapse circuits arranged in the i direction are connected to positive and negative voltage sources +5 VDC and −5 VDC through identical switches S21 to S24. Each of the switches S21 to S24 comprises two interlocked switch elements. One switch element is connected to the voltage source +5 VDC and the other switch element is connected to the voltage source −5 VDC. The output terminals of the synapse circuits arranged in the j direction are respectively connected to common read lines L21 to L24. One end of each of the common read lines L21 to L24 is grounded through a corresponding one of ammeters 51 to 54. This memory apparatus is a neural network having four neuron elements.

An operation of this embodiment will be exemplified wherein matrix operations are parallelly performed in the memory apparatus having the above neural network.

A 100-ms rectangular pulse of +5 V or −5 V is applied to the write electrodes of the synapse circuits 50(i,j) through the switches S21 to S24 to store voltages of +2 V or −2 V in the capacitors. Note that no voltage is stored in the capacitors in the synapse circuits $50_{11}$, $50_{22}$, $50_{33}$, and $50_{44}$, (i.e., synapse circuits $50_{(i,j)}$ (i=j)), so that the potentials of these capacitors are set to 0 V.

In this state, when the switches S21, S22, S23, and S24 are respectively turned on, off, on, and off, values at the ammeters 51, 52, 53, and 54 are as shown in FIG. 9. When combinations of capacitor voltages of the synapse circuits $50_{(i,j)}$ are given, as shown in FIG. 9, values at the ammeters 51, 52, 53, and 54 are $-200$ mA, 0 mA, $+200$ mA, and $-400$ mA, respectively.

Assume that ON and OFF states of the switches S21, S22, S23, and S24 are respectively given as "0" and "1"; that when the capacitor voltage of the synapse circuit $50_{(i,j)}$ is $+2$ V, a value in FIG. 9 is given as $+1$; that when the capacitor voltage of the synapse circuit $50_{(i,j)}$ is 0 V, a value in FIG. 9 is given as 0; and that when the capacitor voltage of the synapse circuit $50_{(i,j)}$ is $-2$ V, a value in FIG. 9 is given as $-1$. Values obtained by dividing values of the ammeters 51, 52, 53, and 54 by $+200$ mA are shown in FIG. 10.

As shown in FIG. 10, combinations of the capacitor voltages of the synapse circuits $50_{(i,j)}$ arranged in a matrix form and the currents flowing through the ammeters 51 to 54 are equivalent to matrix operations by the following matrix. That is, $$(1, 0, 1, 0) \begin{bmatrix} 0 & +1 & +1 & -1 \\ +1 & 0 & -1 & -1 \\ -1 & -1 & 0 & -1 \\ -1 & +1 & +1 & 0 \end{bmatrix} = (-1, 0, +1, -2)$$

The ON and OFF states of the switches S21, S22, S23, and S24 are vector data, the memory voltages of the capacitors of the synapse circuits $50_{(i,j)}$ are matrix data, and values of the ammeters 51, 52, 53, and 54 are vector data after matrix operations.

The speed of the above matrix operations is equal to the switching speed of one transistor used in the synapse circuit regardless of the number of dimensions of the matrix if mounting factors such as delays caused by a circuit parasitic capacitance are not taken into consideration. When the memory apparatus of the third embodiment is used, a multidimensional matrix operation can be performed at high speed.

The fourth embodiment of the present invention will be described below.

Processing using a Hopfield model is executed by using the memory apparatus described with reference to the third embodiment.

A Hopfield model is a mathematical model proposed by J. J. Hopfield in 1982 as a simple model for operating a neural network. This model basically simulates an "association function" as one of the brain functions. Since a general matrix operation method is used as a calculation method for this model, network hardware can be relatively easily obtained.

The first application of the Hopfield model was an optical application made by N. H. Farhat et al. in 1985 Applied Optics, Vol 24, No. 10, 1469. However, since negative information cannot be optically dealt, and a light-transmitting mask manufactured by a photographic method is used as a memory matrix, a memory cannot be updated in practice.

The memory apparatus of the fourth embodiment can process negative data, and the memory can be updated. At the same time, the Hopfield model is performed by parallel processing, and an association calculation can be performed. The outline of the Hopfield model and a correspondence between the Hopfield model and the memory device will be described below.

An association function is a function for calling a storage content most similar to "vague" input data. Data processed in this model are vectors $Vi^{(m)}$ having two values $+1$ and $-1$.

The dimension of the vector is N, and the number of types of vector is M, so that $$\left. \begin{array}{l} i = 1, 2, 3, \ldots, M \\ m = 1, 2, 3, \ldots, M \end{array} \right\} \quad (6)$$

These vector data are stored in the form of a Tij matrix defined by equation (7).

$$Tij = \sum_{m=1}^{M} V_i^{(m)} V_j^{(m)} \quad (7)$$

for $(i,j) = 1, 2, \ldots, N$, and $Tii = 0$

When the Tij matrix is multiplied with $Vj^{(mo)}$ for $m = mo$ to read-access the memory, the following equation is obtained:

$$\hat{V}_i^{(mo)} = \sum_j^N T_{ij} V_j^{(mo)} \quad (8)$$

$$= \sum_{j \neq i}^{N} \sum_m^N V_i^{(m)} V_j^{(m)} V_j^{(mo)}$$

Therefore, $$\hat{V}_i^{(mo)} = (N-1) V_i^{(m)} + \sum_{m \neq mo} a_{m,mo} V_i^{(m)} \quad (9)$$

where $$a_{m,mo} = \sum_j^N V_j^{(mo)} V_j^{(m)}$$

The first term of equation (9) is obtained by multiplying $Vj^{(mo)}$ with $(N-1)$. The second term of equation (9) represents a so-called crosstalk (noise) component obtained by randomly adding vector components. Since $am$ and $mo$ are obtained by randomly adding $+1$ and $-1$ $(N-1)$ times, their average value is zero and a standard deviation is $\sqrt{(N-1)}$. The second term of equation (9) is a sum obtained by adding the standard deviation $(M-1)$ times, and a standard deviation as $\sqrt{(N-1)(M-1)}$. If N is sufficiently larger than M, the following condition is given:

$$(N-1) >> \sqrt{(N-1)(M-1)}$$

so that $\hat{V}i^{(mo)}$ has a high probability of assuming a positive value when $Vi^{(mo)} = +1$, and vice versa when $Vj^{(mo)} = -1$. When all the values of $\hat{V}i^{(mo)}$ are positive, all $+1$s are obtained. Otherwise, all $-1$s are obtained, thus converting the values in accordance with the threshold values. That is, $\text{sgn}[\hat{V}i^{(mo)}]$ comes close to a value of $Vi^{(mo)}$. The value of $\text{sgn}[\hat{V}i^{(mo)}]$ is given as a new $Vi^{(mo)}$, and the calculations are repeated to converge the $\text{sgn}[\hat{V}i^{(mo)}]$ to $Vi^{(mo)}$.

Even if some input vectors are different from the values of $Vj^{(mo)}$, and if the number of error bits is small with respect to N, $\text{sgn}[\hat{V}i^{(mo)}]$ comes close to $Vi^{(mo)}$ from the input vectors, thereby performing association processing.

The outline of the association processing based on the Hopfield model has been described above. This calculation technique is shown in FIGS. 11 and 12.

Figures 11, 12, 13:
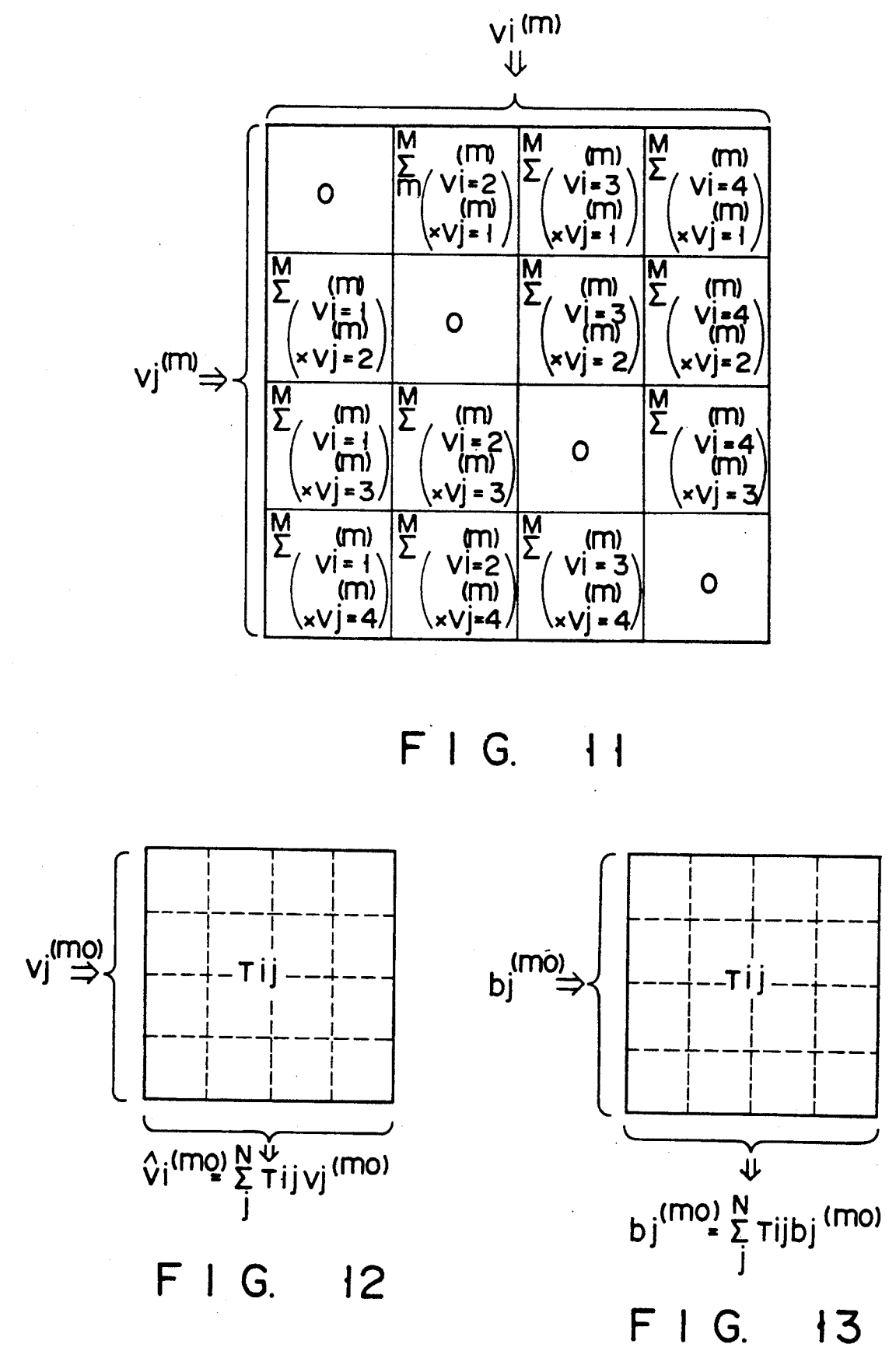

FIG. 11 shows a method for writing $Vi^{(m)}$ vectors in the Tij matrix. The illustrated values are stored in the respective matrix elements. FIG. 12 shows a method of calling $\dot{V}i^{(mo)}$ by multiplying the Tij matrix with $Vj^{(mo)}$.

In order to the perform matrix operation of FIG. 12 in the memory apparatus shown in FIG. 12, voltages corresponding to the values of the matrix Tij are charged in the capacitors of the synapse circuits (i,j), and the switches S21, S22, S23, and S24 are turned on/off in correspondence with the values of $Vj^{(mo)}$. Note that when the switch ON states are caused to correspond to the values of +1 of $Vj^{(mo)}$, the switch OFF state is set to correspond to zero. In order to prevent this, the values of $Vi^{(m)}$ are changed from +1 or −1 to a unipolar value of +1 or 0, and the vector is rewritten as $bi^{(m)}$. Even if $(2bi^{(m)}-1)$ is substituted into $Vi^{(m)}$ in equation (7) and Vj(mo) in equation (8) is rewritten by $bj^{(mo)}$, $sgn[bi^{(mo)}]$ can be converged to $bi^{(mo)}$. That is, the association function is maintained.

In this case, the values of the respective elements in the matrix Tij are the same as those in FIG. 11. In order to obtain $\dot{b}i^{(mo)}$ from $bi^{(mo)}$, calculations in shown in FIG. 13 are performed.

In a matrix operation shown in FIG. 13, the ON/OFF states of the switches S21, S22, S23, and S24 correspond to values (+1,0) of $bj^{(mo)}$. Values measured by the ammeters 51, 52, 53, and 54 and obtained by inputting the values of $bj^{(mo)}$ with the switches correspond to the values of $bj^{(mo)}$ in FIG. 13. The values of the respective elements of the matrix Tij are converted into three values (+1, 0, −1) such that all positive values are clipped to be +1 and all negative values are clipped to be −1. The calculation method shown in FIG. 10 is employed using the converted values to obtain an approximate association function.

According to this embodiment, therefore, by using the memory apparatus shown in FIG. 8, an electrical operation of the Hopfield model can be performed. Since the vectors are subjected to parallel processing in units of vector elements, the operation speed can be largely increased. In addition, since the circuit is simple, a chip having a high integration density can be easily obtained. Therefore, a high-precision, large capacity association type neural network chip is expected to be obtained.

Since the voltage of the capacitor for storing the value of Tij can be electrically erased or rewritten, arbitrary write or updating access of the memory content (Tij values) on a single chip can be facilitated. For this reason, the memory apparatus of this embodiment can be applied to a learning type neural network.

According to the present invention, as has been described above, there is provided a memory device and a memory apparatus suitable for realizing a neural network by using a small number of circuit elements, a simple circuit arrangement, and simple data processing.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A memory device comprising:
   a nonlinear electric conductivity element, having an insulating layer with opposite surfaces, and first and second conductive layers respectively formed on said opposite surfaces of said insulating layer, for receiving an external write signal applied to one of said first and second conductive layers and outputting a signal having nonlinear electric conductivity characteristics from another of said first and second conductive layers;
   a charge accumulation element having charge accumulation characteristics and coupled to receive and store the signal output from said other of said first and second conductive layers; and
   switching means, ON/OFF-controlled upon reception of a signal charge stored in said charge accumulation element, for receiving an external read voltage to read out the signal charge stored in said charge accumulation element as storage data.

2. A device according to claim 1, wherein said switching means includes a first switching element applied with a positive read voltage and ON/OFF-controlled by a signal charge stored in said charge accumulation element, and a second switching element applied with a negative read voltage and ON/OFF-controlled by the signal charge stored in said charge accumulation element.

3. A device according to claim 2, wherein said first and second switching elements include n- and p-channel field effect transistors connected complementarily to each other.

4. A device according to claim 1, wherein said insulator includes a polyimide thin film formed by a Langmuir-Blodgett method.

5. A device according to claim 1, wherein said charge accumulation element includes a capacitor.

6. A memory apparatus comprising:
   a plurality of memory devices, each having
   (a) a nonlinear electric conductivity element, having an insulating layer with opposite surfaces, and first and second conductive layers respectively formed on said opposite surfaces of said insulating layer, for receiving an external write signal applied to one of said first and second conductive layers and outputting a signal having nonlinear electric conductivity characteristics from the other of said first and second conductive layers;
   (b) a charge accumulation element having charge accumulation characteristics and coupled to receive and store the signal output from said other of said first and second conductive layers; and
   (c) switching means, ON/OFF-controlled upon reception of a signal charge stored in said charge accumulation element, for receiving an external read voltage to read out the signal charge stored in said charge accumulation element as storage data;
   first connecting means connected to cause said switching elements of at least two of said plurality of memory devices to commonly receive the external read voltage; and
   second connecting means connected to cause said switching elements of said at least two memory devices to commonly read out the storage data,
   whereby said plurality of memory devices are connected in a matrix form.

7. An apparatus according to claim 6, wherein said switching means includes a first switching element applied with a positive read voltage and ON/OFF-controlled by a signal charge stored in said charge accumulation element, and a second switching element applied with a negative read voltage and ON/OFF-controlled by the signal charge stored in said charge accumulation element.

8. An apparatus according to claim 7, wherein said first and second switching elements include n- and p-channel field effect transistors connected complementarily to each other.

9. An apparatus according to claim 6, wherein said insulator includes a polyimide thin film formed by a Langmuir-Blodgett method.

10. An apparatus according to claim 6, wherein said charge accumulation element includes a capacitor.

11. An apparatus according to claim 6, wherein said plurality of memory devices connected in the matrix form perform parallel matrix processing based on common vector data externally supplied through said first connecting means, and at the same time output results of the parallel matrix processing through said second connecting means.

12. An apparatus according to claim 11, wherein said memory apparatus has an association function of calling a storage content most similar to vague input data by performing a Hopfield model by the parallel matrix processing when the vague data is input to said memory apparatus.

* * * * *